United States Patent
Nikitin et al.

(10) Patent No.: US 7,023,204 B2
(45) Date of Patent: Apr. 4, 2006

(54) MAGNETIC IMAGING MICROSCOPE TEST SYSTEM AND ITS APPLICATION FOR CHARACTERIZATION OF READ AND WRITE HEADS FOR MAGNETIC RECORDING

(75) Inventors: Vladimir Nikitin, Campbell, CA (US); Katalin Pentek, San Jose, CA (US)

(73) Assignee: International Business Machine Corporation, Armonk, NY (US)

( * ) Notice: Subject to any disclaimer, the term of this patent is extended or adjusted under 35 U.S.C. 154(b) by 77 days.

(21) Appl. No.: 10/298,880

(22) Filed: Nov. 18, 2002

(65) Prior Publication Data

US 2004/0095133 A1    May 20, 2004

(51) Int. Cl.
*G01R 33/12* (2006.01)

(52) U.S. Cl. ..................... 324/210; 324/252
(58) Field of Classification Search ............ 324/210, 324/252, 244, 235, 244.1; 250/306, 307, 250/311; 305/171, 172
See application file for complete search history.

(56) References Cited

U.S. PATENT DOCUMENTS

| | | | |
|---|---|---|---|
| 5,171,992 A | 12/1992 | Clabes et al. ............... 250/306 |
| 5,266,897 A | 11/1993 | Watanuki et al. ........... 324/244 |
| 5,331,589 A | 7/1994 | Gambino et al. .......... 365/151 |
| 5,465,046 A | 11/1995 | Campbell et al. ........... 324/244 |
| 5,900,728 A | 5/1999 | Moser et al. ................ 324/244 |
| 5,900,729 A | 5/1999 | Moser et al. ................ 324/244 |
| 5,939,715 A * | 8/1999 | Kitamura et al. ........... 250/234 |
| 6,064,201 A | 5/2000 | Cha et al. .................... 324/228 |
| 6,211,673 B1 | 4/2001 | Gerber et al. ............... 324/262 |
| 6,657,431 B1 * | 12/2003 | Xiao ........................... 324/244 |

FOREIGN PATENT DOCUMENTS

| JP | 10-019907 | 1/1998 |
|---|---|---|
| JP | 10-019909 | 1/1998 |

* cited by examiner

*Primary Examiner*—Bot Ledynh
*Assistant Examiner*—Reena Aurora
(74) *Attorney, Agent, or Firm*—Walter W. Duft

(57) ABSTRACT

A novel magnetic imaging microscope test system with high spatial (1–10 nm) and temporal (~1 ns) resolution of the magnetic field is disclosed, as well as the system application for characterization of read and write heads for magnetic recording. The test system includes a scanner assembly and a work piece holder for holding a work piece to be tested. The scanner assembly and the work piece holder are positionable relative to each other at very fine resolution during scanning. A probe arm is cantilevered from the scanner assembly to bring a probe head into close proximity to the work piece holder. The probe head is configured scan a work piece in contacting engagement therewith so that a magnetic device on the probe head magnetically interacts with a magnetic field generating or magnetic field sensing device on the work piece. A probe head for use in the test system and a related test method are also disclosed.

30 Claims, 14 Drawing Sheets

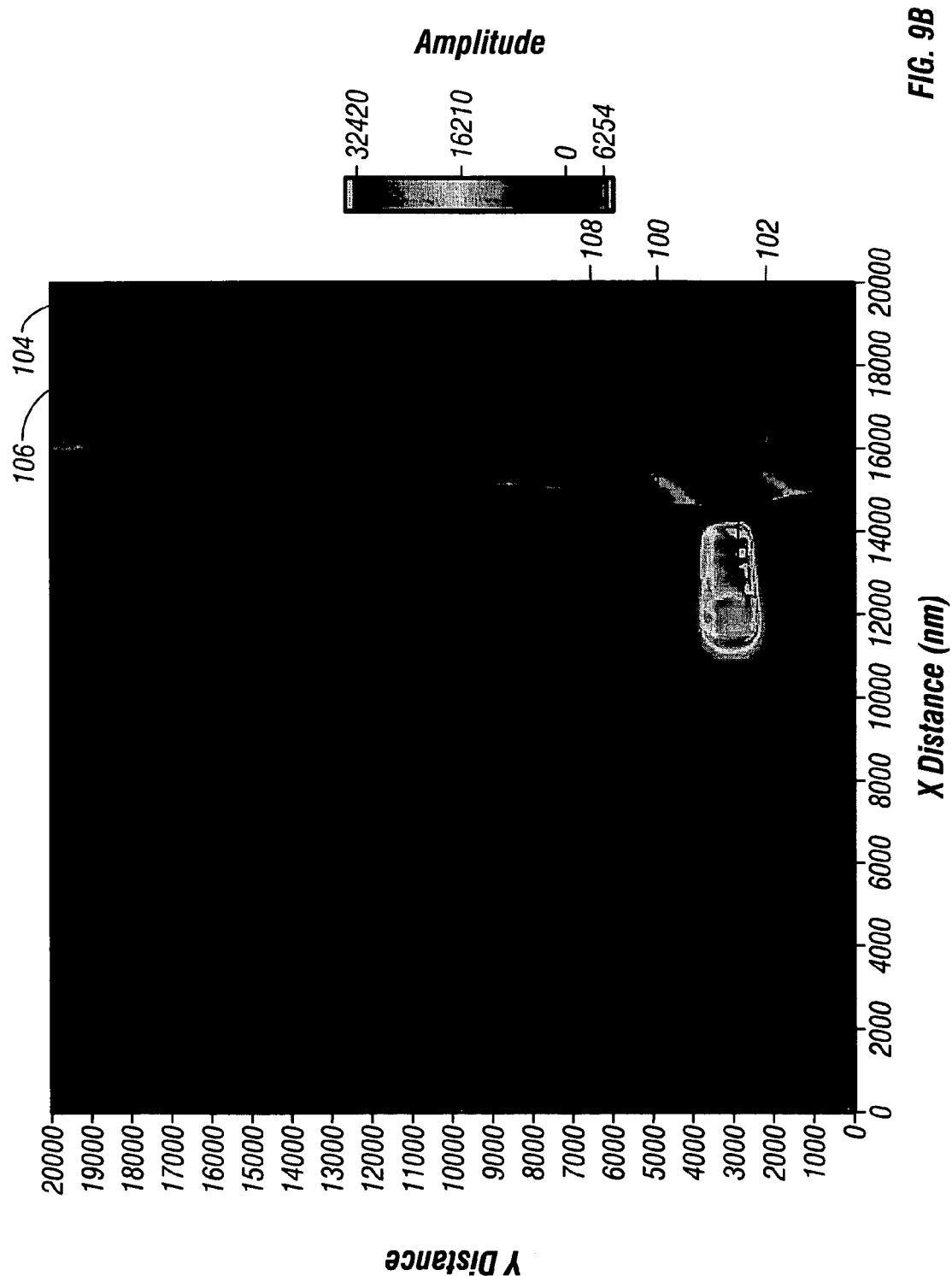

MAGNETIC IMAGING MICROSCOPE TEST SYSTEM AND ITS APPLICATION FOR CHARACTERIZATION OF READ AND WRITE HEADS FOR MAGNETIC RECORDING

BACKGROUND OF THE INVENTION

1. Field of the Invention

The present invention relates to the field of scanning microscopy. More particularly, the invention concerns the non-intrusive magnetic imaging of devices and systems that generate and/or sense magnetic fields, including the magnetic field output of magnetic write heads and the magnetic response of magnetic read heads.

2. Description of the Prior Art

By the way of background, current methods for magnetic imaging suffer from various limitations. The most widespread method is Magnetic Force Microscopy (MFM). Even though MFM provides high spatial resolution, it does not actually measure magnetic field, but rather the magnetic field gradient, making interpretation of the images difficult and, in some cases, impossible to de-convolute. Additionally, MFM only works with static magnetic fields and has no time-domain capabilities. Another wide-spread magnetic imaging method is Kerr microscopy, which does provide time-resolved magnetic field imaging. However, Kerr microscopy can only image magnetization of the material, thus limiting the technique in the choice of materials. Additionally, because Kerr microscopy is an optical technique, the spatial resolution is limited by the wavelength of light. More recent advances in the field of magnetic imaging, such as Lorenz microscopy, ballistic electron emission microscopy, and polarization X-ray microscopy also suffer from various limitations, and are complicated and expensive.

Accordingly, a need exists for a new technique for magnetic imaging that can provide unambiguous magnetic field mapping with high spatial resolution, and which also preferably provides time-domain capabilities. One area where such a technique could be immediately utilized is the characterization of magnetic recording heads. Although a variety of characterization techniques have been developed in this area, they involve characterization of a more complicated system, which includes not only the head for magnetic recording, but also the magnetic recording media and the electronics for operating the head. In addition to being an indirect method of head characterization, these methods involve long evaluation cycles and the high cost associated with building individual sliders.

What is therefore required is a magnetic imaging system that allows non-intrusive imaging of magnetic fields with high (e.g., ~1–10 nm) spatial resolution and high (e.g. ~1 nsec or better) temporal resolution, and whose functions include imaging the time-resolved magnetic field output of a magnetic write head and imaging the magnetic response of a magnetic read head.

SUMMARY OF THE INVENTION

The foregoing problems are solved and an advance in the art is obtained by a magnetic imaging microscope test system that can be utilized for characterization of read and write heads used for magnetic recording, and for characterization of other structures that are magnetic in nature or which otherwise produce magnetic fields (such as AC current-carrying wires).

According to the invention, the test system can be operated in two main modes. In the first mode, which may be called imaging mode, a magnetic field sensor is used to raster-scan over the surface of a work piece (test sample) and acquire an image of the magnetic field to be characterized. In the second mode, which may be called stimulation mode, a structure that produces a tunable local magnetic field, referred to herein as a "magnetic stencil," is used to raster-scan over the surface of a work piece while the magnetic response of the work piece is recorded to form an image.

The test system further includes a scanner assembly and a work piece holder for holding the work piece to be tested. The scanner assembly and the work piece holder are positionable relative to each other at a coarse resolution, while the image is acquired by scanning at very fine resolution, preferably using piezoelectric scanner. A probe arm is cantilevered from the scanner assembly and extends to a probe arm free end situated adjacent the work piece. A probe head is disposed at the probe arm free end and incorporates a magnetic device comprising either a magnetic field sensor, a magnetic stencil, or both. The test system may further incorporate a laser that focuses a laser beam on the back side of the probe head, which reflects the beam to a detector. The reflected beam is used to adjust the angle between the probe head and the work piece, and with feedback circuitry, can be used to maintain that angle at a pre-determined setting during the scanning, to ensure constant distance between the magnetic device and the work piece surface.

In the imaging mode of operation, a variety of magnetic sensors can be used. The choice of the sensor is application dependent, and is determined based on whether the in-plane or out-of-plane component of the magnetic field is to be studied, by the magnitude of the magnetic field, and by dynamics of the magnetic field.

In one exemplary magnetic sensor embodiment, the sensor comprises a magnetic flux pick-up loop having a short section providing a sensor tip portion and a pair of legs extending therefrom to a pair of electrical contacts. An electrically conductive ground plane is spaced from the pick-up loop. This sensor produces output voltage proportional to the magnitude of time-variant magnetic fields introduced into the pick-up loop tip portion in a direction parallel to the work piece surface and perpendicular to the loop plane.

In another exemplary magnetic sensor embodiment, the sensor comprises a layer of soft ferromagnetic material forming a sensor tip portion sandwiched between layers of non-magnetic electrically conductive material. Operation of this sensor is based on the anisotropic magneto-resistance effect (AMR), and the sensor resistance change is proportional to the magnitude of magnetic fields in a direction parallel to the work piece surface and perpendicular to the sensor layer planes.

In yet another exemplary magnetic sensor embodiment, the sensor comprises a multilayer structure, similar to the giant-magneto-resistance (GMR) structures used in the read heads for magnetic recording. One edge of the multilayer structure provides a sensor tip portion. According to one construction, the change in resistance of the sensor is roughly proportional to the magnitude of magnetic fields in a direction perpendicular to the work piece surface and parallel to the layer planes. According to another construction, the change in resistance of the sensor is roughly proportional to the magnitude of magnetic fields in a direction parallel to the work piece surface and perpendicular to the layer planes. Other exemplary embodiments, using tunneling magneto-resistance (TMR) and variations of the GMR, TMR, and AMR structures may also be constructed.

The imaging mode of the test system can be used for characterization of magnetic recording write heads, in which case any of the aforementioned magnetic sensors may be incorporated on the probe head while the test system is operated in the imaging mode to characterize the magnetic output of the field generator. During imaging, an AC write current is applied to the write head at the desired frequency, which is preferably the same frequency at which the head operates in a disk drive for magnetic recording. This results in a time-varying magnetic field being generated at the ABS surface of the write head. By imaging this field, the parameters important for write head evaluation, such as field amplitude, field gradient, erase bands, overwrite, adjacent track interference, and write bubble speed can be determined.

When the test system is used in the stimulation mode, the probe head may incorporate the aforementioned magnetic stencil to produce a local magnetic field, which, optionally, could be time-dependent.

In one exemplary magnetic stencil embodiment, the stencil comprises an inductive coil driving a pair of soft magnetic pole pieces, one of which is extended to form a stencil tip. By passing electrical current into the coil, the magnetization of the pole pieces is changed, resulting in a magnetic field being generated from the end of the extended pole piece, perpendicular to the work piece surface. The magnetic field is confined to the cross-sectional size of the extended pole piece.

In another exemplary magnetic stencil embodiment, the stencil comprises a wire that is used to drive a soft adjacent ferromagnetic layer providing a stencil tip portion. The wire passes an electrical current that alters the magnetic moment of the ferromagnetic layer according to fluctuations in current magnitude and direction. This stencil generates a magnetic field that is perpendicular to the work piece surface and parallel to the ferromagnetic layer plane.

In still another exemplary magnetic stencil embodiment, the stencil comprises a pair of conductive electrodes, separated by thin insulation layer, with electrical current flowing in opposite directions through the electrodes. Each electrode has a short section providing a stencil tip portion. This results in a magnetic field confinement between the tip portion with the magnetic field emerging from the gap in the direction perpendicular to the work piece surface and parallel to the layer planes.

The stimulation mode of operation can be applied for characterization of the sensors of magnetic recording read heads. The magnetic stencil is scanned over the read sensor and driven by an AC current while the response of the sensor, i.e. it's change in resistance, is recorded. By doing so, parameters such as magnetic read track width, amplitude, pulse width at half amplitude (PW50), and position-dependent stability can be determined. By repeating the scans at varied stencil amplitude, position-dependent transfer curves can be obtained, allowing extraction of the sensor stiffness and hard bias properties.

In each of the foregoing embodiments, the magnetic sensor/stencil may be adapted for operation at a spatial resolution of between approximately 1–10 nm at the adjustable distance from the surface of the sample and a temporal resolution as high as approximately 1 nsec.

BRIEF DESCRIPTION OF THE DRAWING

The foregoing and other features and advantages of the invention will be apparent from the following more particular description of preferred embodiments of the invention, as illustrated in the accompanying Drawing, in which:

FIG. 9B is example of the magnetic field image of another magnetic recording write head produced by the magnetic imaging microscope test system FIG. 1, scanning in the second direction;

DETAILED DESCRIPTION OF PREFERRED EMBODIMENTS

Figure 1:
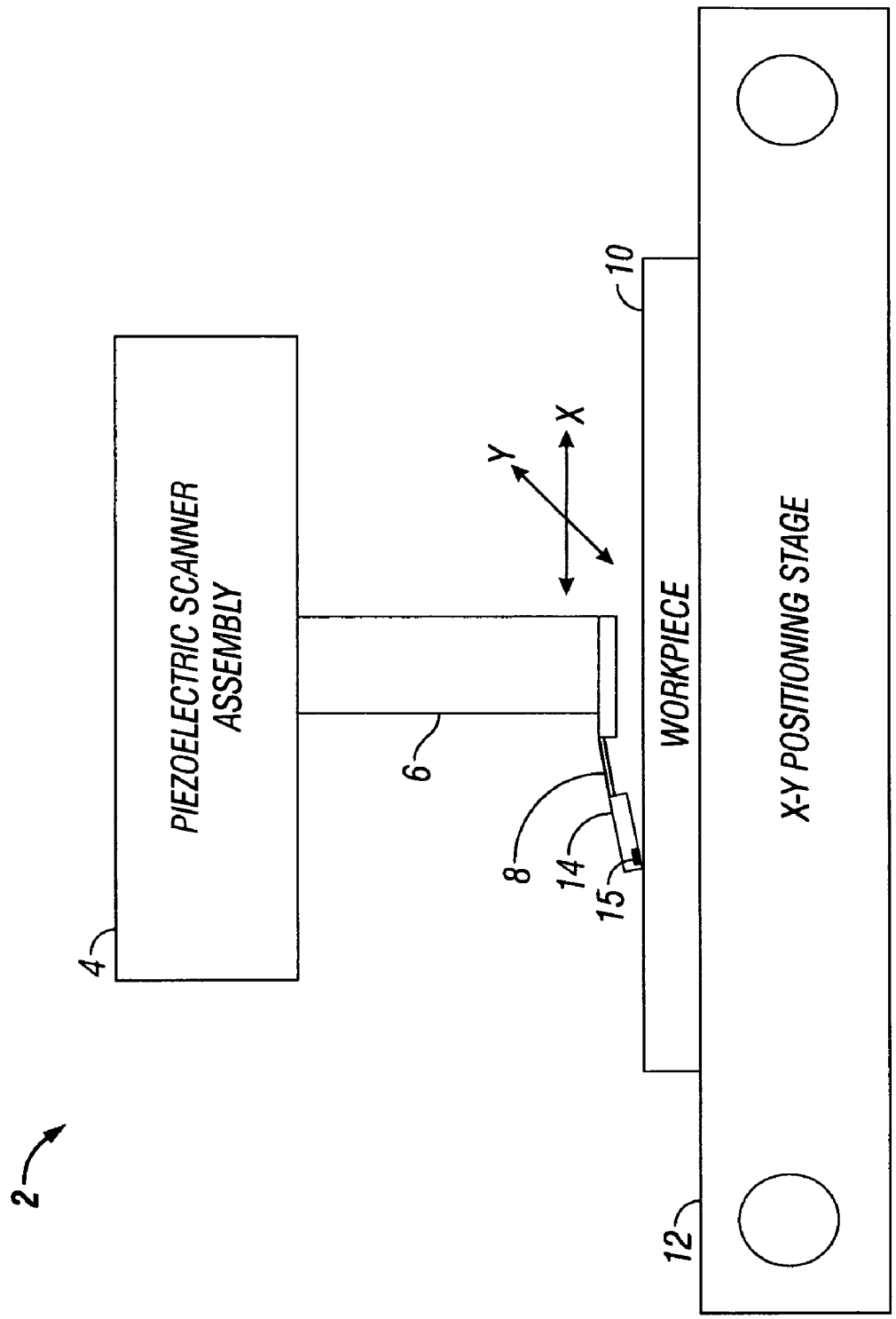
FIG. 1 is a schematic view of a magnetic imaging microscope test system constructed in accordance with the present invention.

Turning now to the figures, wherein like reference numerals represent like elements in all of the several views, FIG. 1 illustrates a magnetic imaging microscope test system 2 adapted for high resolution magnetic characterization of magnetic field generating and sensing devices, and particularly disk drive inductive write heads and magnetoresistive read heads. The test system 2 includes a scanner assembly 4 that is preferably adapted for very finely controllable (e.g., ~1 nm) resolution) two-dimensional movement in the directions shown by the x and y axes in FIG. 1. A conventional piezoelectric control system of the type used in a standard MFM may be used for this purpose. The scanner assembly 4 includes a piezoelectric assembly 6 that carries a probe arm 8. The probe arm 8 is cantilevered from the piezoelectric assembly 6 so as to extend toward a work piece 10. In the context of the present invention, the work piece 10 will comprise a magnetic field generating or sensing device, such as a magnetic disk drive write head or read head, or a collection of such devices arranged in a single slider row or in multiple slider rows on a wafer substrate. The work piece 10 is supported on a stage 12 that acts as a work piece holder and is preferably adapted for gross positioning of the work piece 10 in the directions shown by the x and y axes in FIG. 1.

A probe head 14 is disposed at the free end of the probe arm 8. It is configured to slidably engage the work piece 10, so that a magnetic device 15 incorporated on the probe head (i.e., a magnetic stencil or sensor as described in more detail below) can be operatively positioned for magnetic interaction with the work piece.

Figure 2:
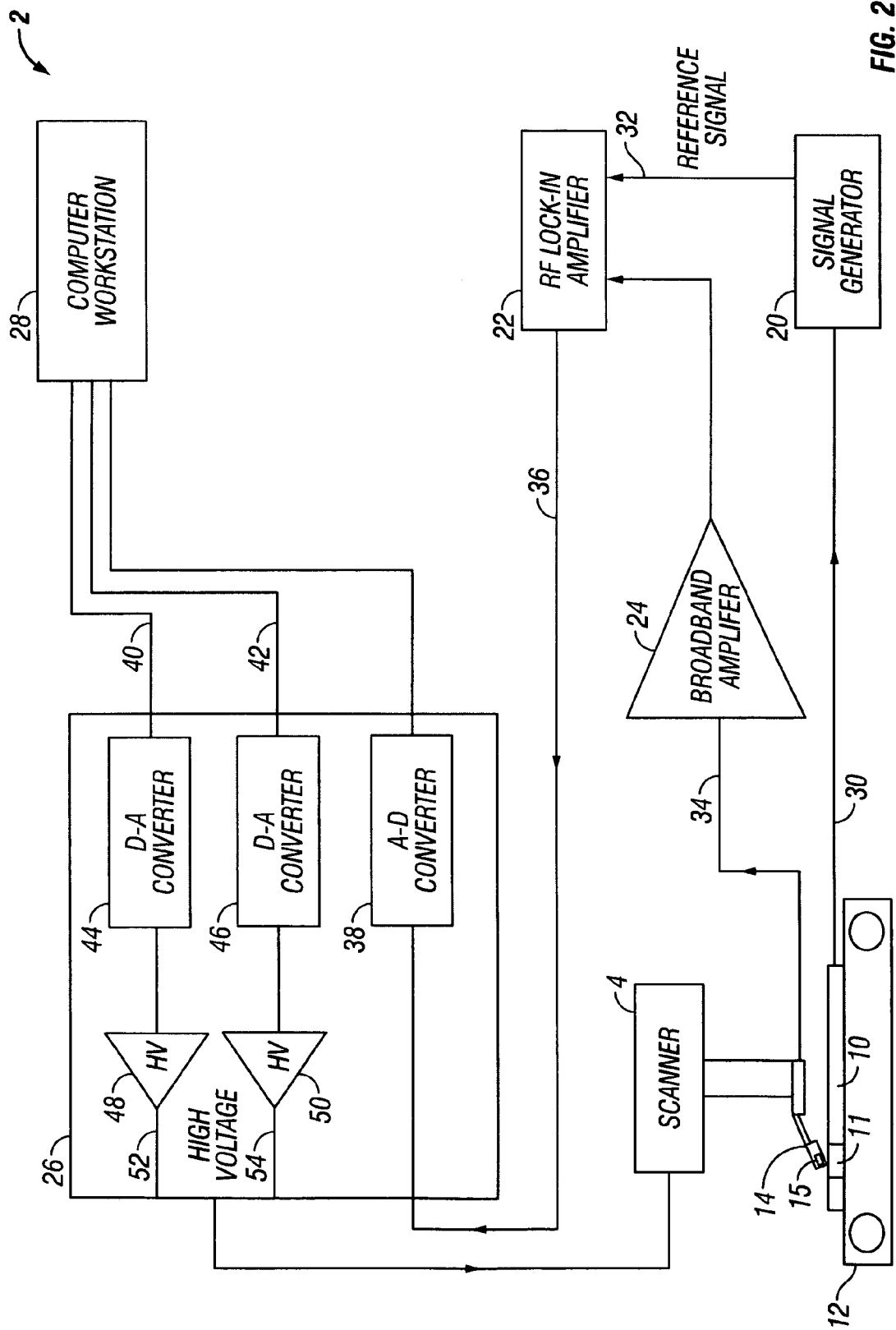
FIG. 2 is a functional block diagram of the test system of FIG. 1 in one test configuration.

Turning now to FIG. 2, many of the functional components of a conventional MFM scanning assembly may be used to implement the electronics of the test system 2, while others are external. These components include a signal generator 20, an RF lock-in amplifier 22, a broadband amplifier 24, an x-y scanning piezo driver system 26, and a data processing system such as a computer workstation 28. In the embodiment of FIG. 2, the work piece 10 comprises magnetic field generators, which, for example, could be one or more disk drive write heads 11. The signal generator 20 generates an appropriate test (stimulus) signal 30, such as a sine wave AC current, to drive the write head 11 to generate a corresponding alternating magnetic field signal. The signal generator 20 also generates a reference signal 32 that is locked in frequency and phase to the stimulus signal 30 and is fed to the reference input of the RF lock-in amplifier 22.

The magnetic device 15 on the probe head 14 is assumed to be a magnetic sensor to generate a readback signal 34 in response to the magnetic fields generated by the write head 11. The readback signal 34 is amplified by the broadband amplifier 24 and fed to the second input of the RF lock-in amplifier 22. The RF lock-in amplifier 22 compares the reference signal 32 and the readback signal 34 and outputs a characterizing signal 36 representing the time-varying magnetic output of the write head 11. The characterizing signal 36 is converted to digital form by an analog-to-digital (A-D) converter 38, and fed to the workstation 28 for evaluation. It will be appreciated that if the frequency (or time) characteristics of the write head 11 are not necessary, a static imaging can be obtained by removing the stimulus signal 30, and only analyzing the average value of the signal 34. It will be further appreciated that the signal generator 20 and the lock-in amplifier 22 could be replaced by a network analyzer. Alternatively the lock-in amplifier 22 could be replaced by digitizing scope, or any other detection device, as determined by the noise level of the system.

In order to test different areas of the write head 11, the workstation 28 generates x and y positioning signals 40 and 42 that are respectively converted to analog form by digital-to-analog (D-A) converters 44 and 46 forming part of the x-y scanning system 26. A pair of high voltage amplifiers 48 and 50, also forming part of the x-y scanning system 26, produce high voltage x and y driving signals 52 and 54 that are used to control the position of the scanner assembly 4 relative to the write head 11. Coarse positioning of the scanner assembly 4 relative to a work piece is performed by the adjusting the x-y positioning stage 12.

Figure 2A:
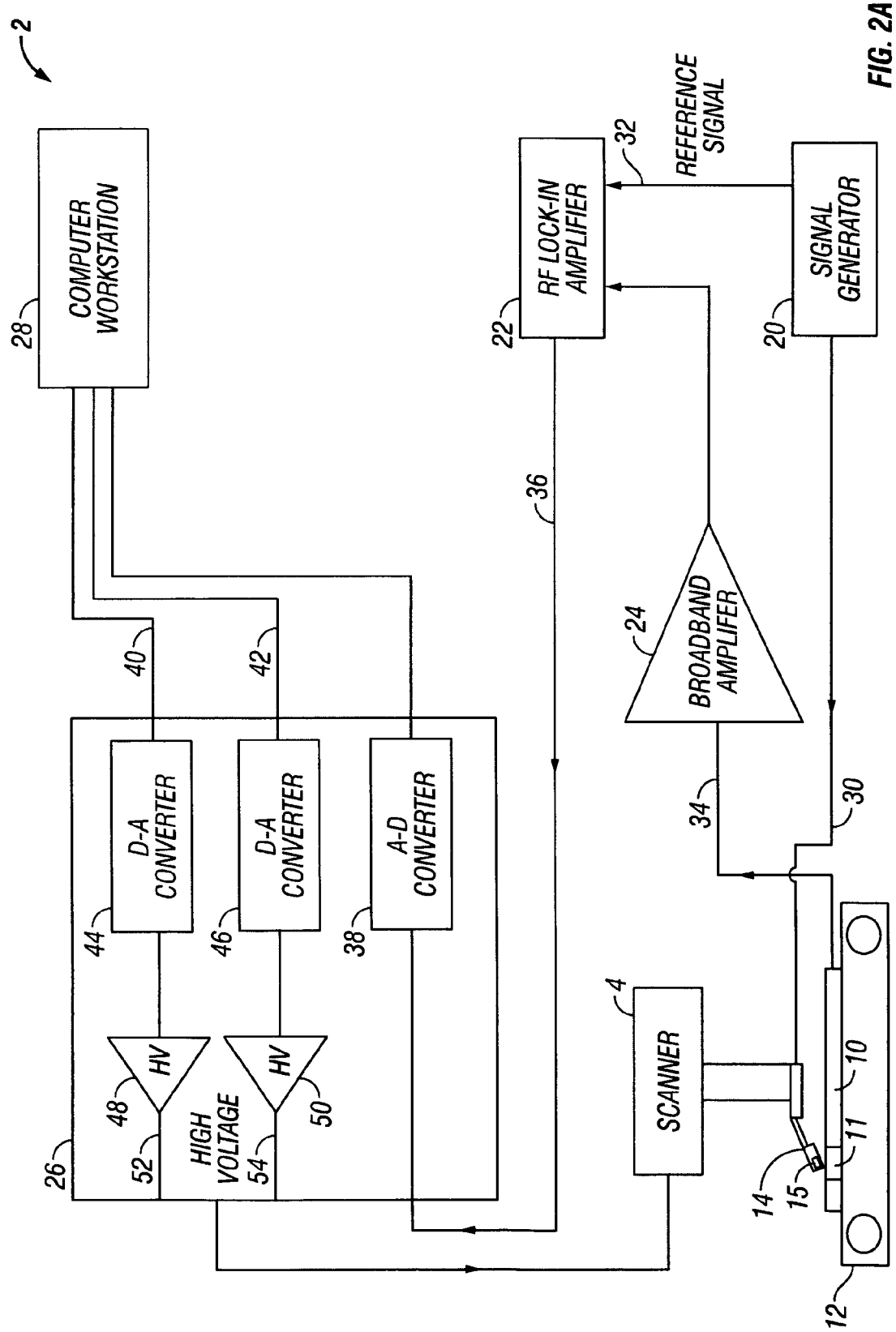
FIG. 2A is a functional block diagram of the test system of FIG. 1 in another test configuration.

Although FIG. 2 illustrates an implementation of the test system 2 that can be used to characterize magnetic field generators, such as magnetic recording write heads, it will be appreciated that the system could be readily adapted to characterize magnetic field sensors, such as magnetic recording read heads, by connecting the signal generator 20 to drive the probe head 14 and connecting the work piece 10 to the broadband amplifier 24. This configuration is shown in FIG. 2A. Moreover, in this configuration, the magnetic device 15 of the probe head 14 would comprise a magnetic stencil, either in lieu of a magnetic sensor or in combination therewith.

Figure 3:
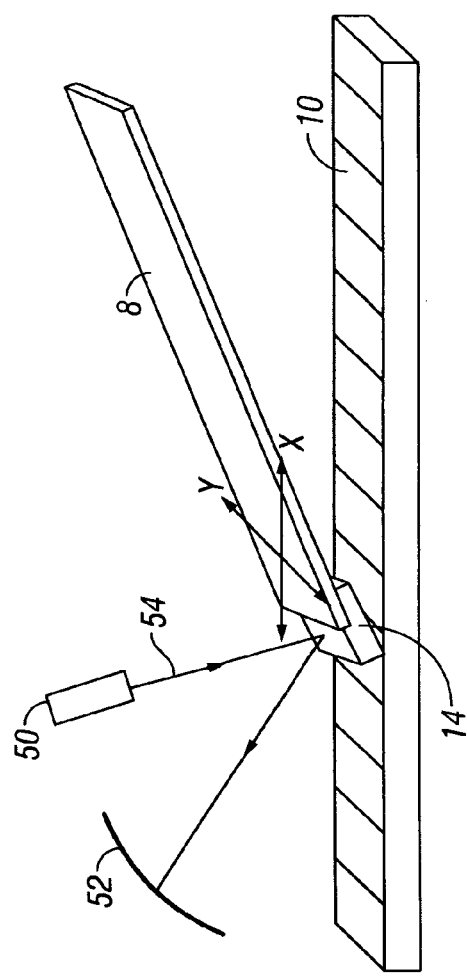
FIG. 3 is a perspective view of a work piece being scanned by the test system of FIG. 1 in a first direction.

Turning now to FIG. 3, one of the features that differentiates the test system 2 from a conventional MFM device is that the probe head 14 is generally large and rectangular, as opposed to the point contact configuration of a conventional MFM probe tip. As a consequence, only topographically flat surfaces can be imaged. However, this provides an advantage in that the feedback mechanism is significantly simplified compared to an MFM, where the feedback circuitry is required to maintain constant separation between the MFM tip and the sample surface. This facilitates a much simpler test procedure and drastically faster scan rates. Moreover, unlike an MFM, the probe head 14 can incorporate a magnetic device 15 that comprises either a magnetic sensor or a magnetic stencil (as described in more detail below) or both, as well as a variety of other lithographically defined structures. This allows the test system 2 to measure magnetic fields instead of just magnetic field gradients, and further allows for dynamic characterization at desired frequencies as well as characterization in different magnetic directions.

In FIG. 3, the work piece 10 is shown to comprise a linear collection of magnetic field generating and/or sensing devices. The work piece 10 is arranged relative to the probe arm 8 such that the magnetic device 15 may be used to image a particular magnetic field direction. As scanning is performed, the electronics of the test system 2 are used to characterize the magnetic properties of the work piece devices.

Note that the work piece 10 may be scanned with the probe head's magnetic device 15 in contacting engagement with the work piece 10 or with the magnetic device spaced from the work piece 10. To maintain a constant separation distance, a conventional laser driver 50 and a laser detector 52 of the type used in MFM systems may be used to detect the angle between the probe head 14 and the work piece 10. As shown in the inset in FIG. 3, the magnetic device 15 is offset a small distance "d" (e.g., 0.1–10 um) from the trailing edge of the probe head 14. At an angle $\partial$ formed by the work piece 10 and probe head 14, the separation of the magnetic device 15 from the work piece surface is equal to $d*\sin(\partial)$.

Therefore, by maintaining a selected angle ∂, the magnetic device 15 of the probe head 14 can be scanned at a desired height above the work piece surface.

Figure 4:
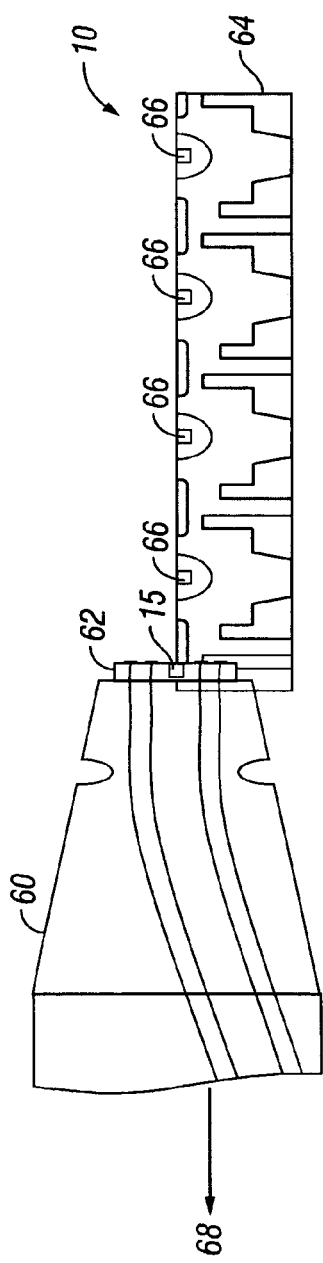
FIG. 4 is a plan view showing an exemplary probe arm and probe head of the test system of FIG. 1 scanning a disk drive slider row in the first direction.

FIG. 4 illustrates a practical use for the scanning orientation of FIG. 3 in an exemplary embodiment of the invention in which the probe arm 8 is formed using a conventional disk drive suspension assembly 60 and wherein the magnetic device 15 is formed as a thin film structure on a conventional disk drive slider 62 (which serves as the probe head 14). The magnetic device 15 is raster-scanned across a slider row 64 that mounts a plurality of magnetic recording heads 66. The primary scanning direction is in the direction shown by the arrow 68. The secondary scanning direction is perpendicular to the arrow 68. The term "raster scanning" refers to the fact that for each scanning position in the primary scanning direction, a perpendicular scan is performed to acquire a series of scanned lines in the secondary scanning direction, in a manner that is analogous to a raster display device.

Figure 5:
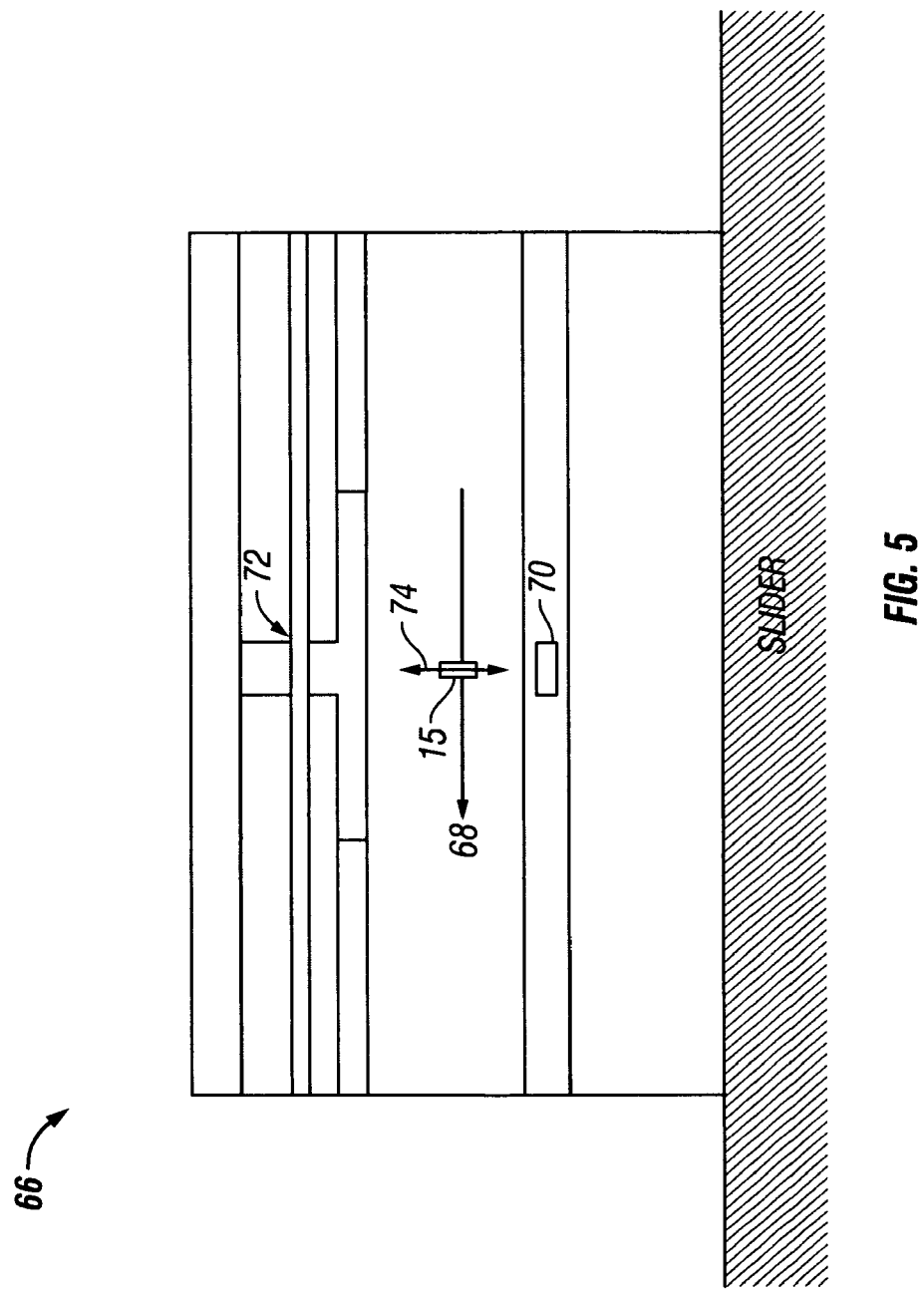
FIG. 5 is an enlarged plan view showing scanning of a slider row read/write head in the first direction.

FIG. 5 illustrates this scanning motion by the magnetic device 15 across a magnetic recording head 66 having a read head 70 and a write head 72. The primary direction of scanning movement (arrow 68) is across the track width of the head 66. The secondary direction of scanning movement is across the gap width of the head 66, as shown by the arrow 74. This kind of scanning facilitates cross-track magnetic profiles that can be used to assess various write head and read head parameters. For example, write heads may be characterized for write width, erase band width, write bubble speed, overwrite (OW), outside and inside diameter non-linear transition shifts (NLTS), and cross-track signal-to-noise ratio (SNR) degradation. Read heads may be characterized for read head transfer curve capability, magnetic read width and magnetic side reading.

Figure 6:
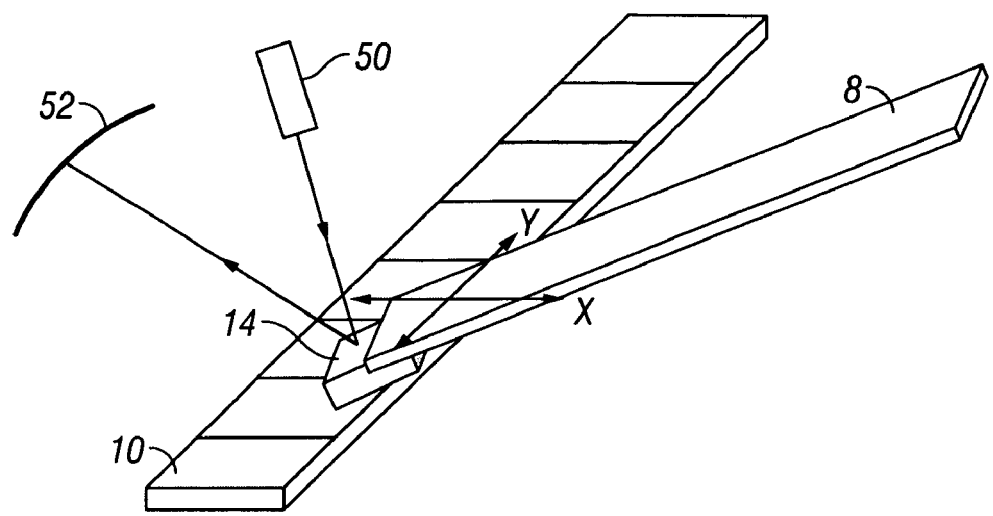
FIG. 6 is a perspective view of a work piece being scanned by the test system of FIG. 1 in a second direction.

Turning now to FIG. 6, the work piece 10, which is again shown as a linear collection of magnetic field generating and/or sensing devices, is arranged relative to the probe arm 8 such that the magnetic device 15 may be used to raster scan the work piece along its transverse axis. As described above in connection with FIG. 5, the angle α of the probe head 14 is maintained using the laser 50 and detector 52 to provide a desired spacing distance between the magnetic device 15 and the work piece 10.

Figure 7:
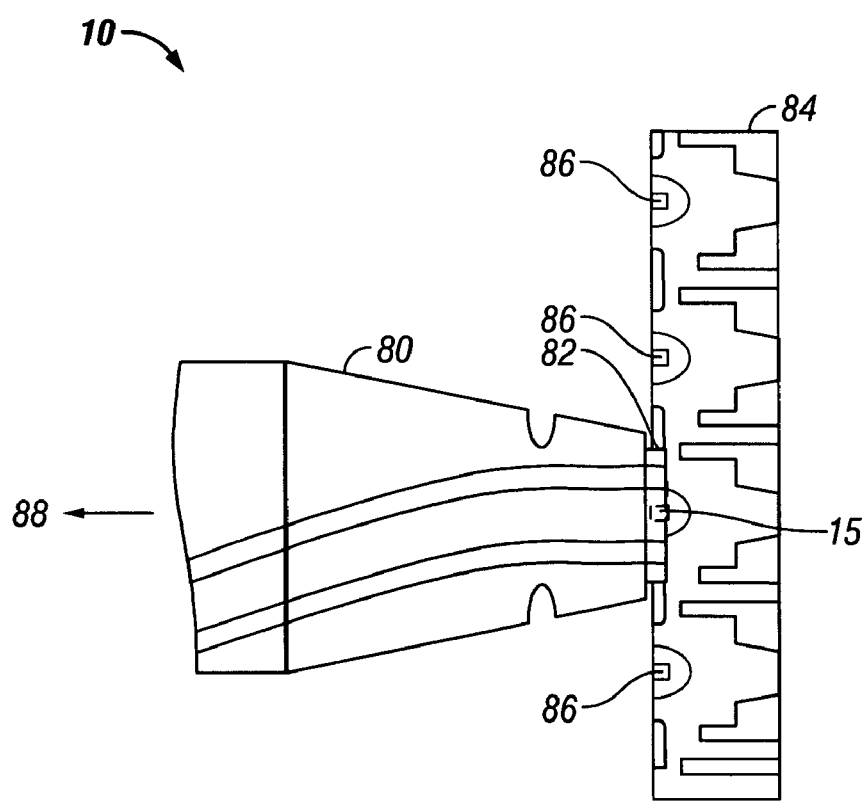
FIG. 7 is a plan view showing an exemplary probe arm and probe head of the test system of FIG. 1 scanning a disk drive slider row in the second direction.

FIG. 7 illustrates a practical use for the scanning orientation of FIG. 6 in an exemplary embodiment of the invention in which the probe amr 8 is again fanned using a conventional disk drive suspension assembly 80 and wherein the magnetic device 15 is formed as a thin film structure on a conventional disk drive slider 82 (which serves as the probe head 14). The magnetic device 15 is raster-scanned across a slider row 84 that mounts a plurality of magnetic recording heads 86. As shown by the crow 88 the primary scanning direction is across individual sliders of the slider row 84. The secondary scanning direction is perpendicular to the arrow 88.

Figure 8:
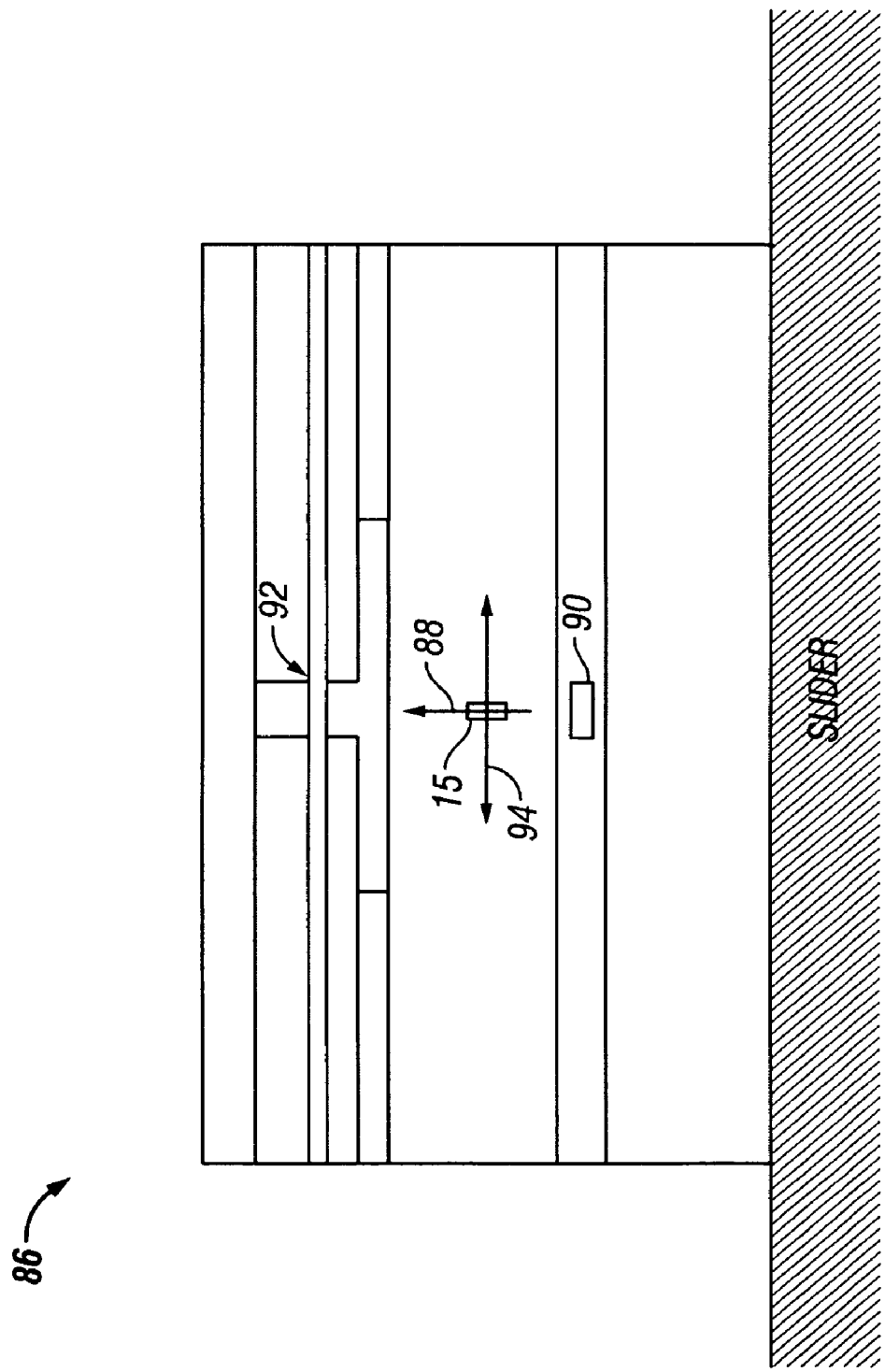
FIG. 8 is an enlarged plan view showing scanning of a slider row read/write head in the second direction.

FIG. 8 illustrates this scanning motion by the magnetic device 15 across a magnetic recording head 86 having a read head 90 and a write head 92. The primary direction of scanning movement is across the gap width of the head 86 (arrow 88) while the secondary direction of scanning movement is across the track width of the head, as shown by the arrow 94. This kind of scanning facilitates additional magnetic profiles that can be used to assess various write bead and read head parameters. For example, write heads may be characterized for gap field at product data rates. Read heads may be characterized for 50% amplitude pulse width (PW 50) and user bit density (PW50/T) measurements.

Figure 9A:
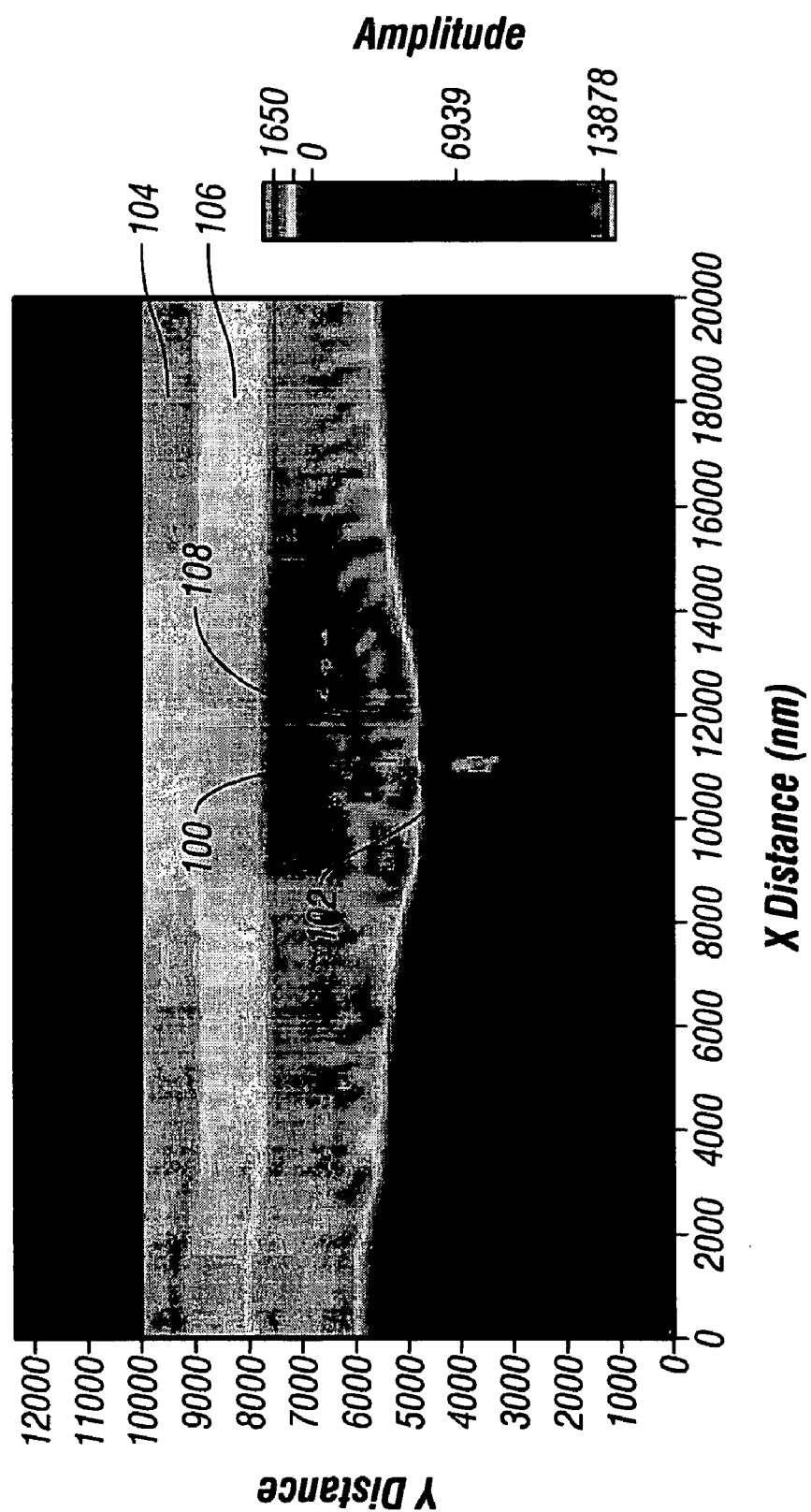
FIG. 9A is a scan image of a magnetic recording write head produced by the magnetic imaging microscope test system of FIG. 1 scanning in the first direction.

As a demonstration of the foregoing scanning techniques, FIGS. 9A and 9B show two images of the magnetic field produced by a conventional disk drive write head at 1 MHz as measured by the test system 2 in the imaging mode and with the magnetic device 15 comprising a magnetic sensor. FIG. 9A shows the magnetic image of the P1 pole 100 and P2 pole 102 when scanned in the direction shown in FIGS. 3–5. A pair of S1 and S2 shields 104 and 106 can also be seen, as well as the formation of magnetic domains 108 in the P1 pole 100. In FIG. 9B, the scanning direction is as shown in FIGS. 6–8. It is revealed that the strongest magnetic field is produced by the P2 pole 100, while the P1 pole 102 and the shields 104 and 106 have a smaller field of opposite polarity.

Figure 10:
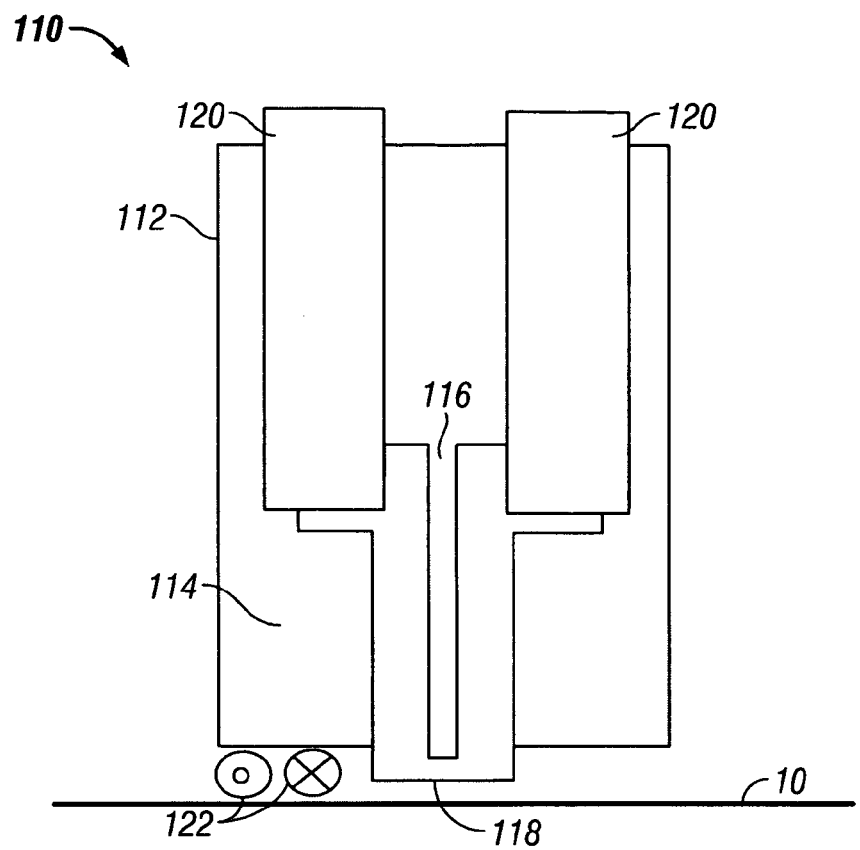
FIG. 10 is a plan view showing a first exemplary embodiment of a probe head magnetic device of the test system of FIG. 1 implemented as a magnetic sensor for magnetic field generator characterization.

Turning now to FIGS. 10–13, exemplary implementations of the magnetic device 15 as magnetic sensor structures for the imaging mode of the test system 2 are shown. In FIG. 10, an exemplary magnetic sensor 110 is formed by a conductive back plane structure 112 made from copper or the like, upon which are formed a flux pickup loop 114 made from a conductive material such as Cu or the like. A gap 116 between the legs of the pickup loop 114 may be in a range of 1–50 nm. A short section 118 of the pickup loop 114 can be lapped to provide a sensor tip portion having a stripe height of about 5–10 nm. time-variant magnetic fields in a direction perpendicular to the plane of the pickup loop 114 and parallel to the surface of the work piece 10 (as shown by the arrow head/tail 122) cause electrical current flow in the loop, which is then sensed through the electric terminals 120 of the sensor 110. Advantageously, only flux changes in the area of the pickup loop 114 close to the sensor tip portion 118, which is not backed up by the conductive plane 112, are detected. Thus, high spatial resolution of local magnetic fields can be achieved.

Figure 11:
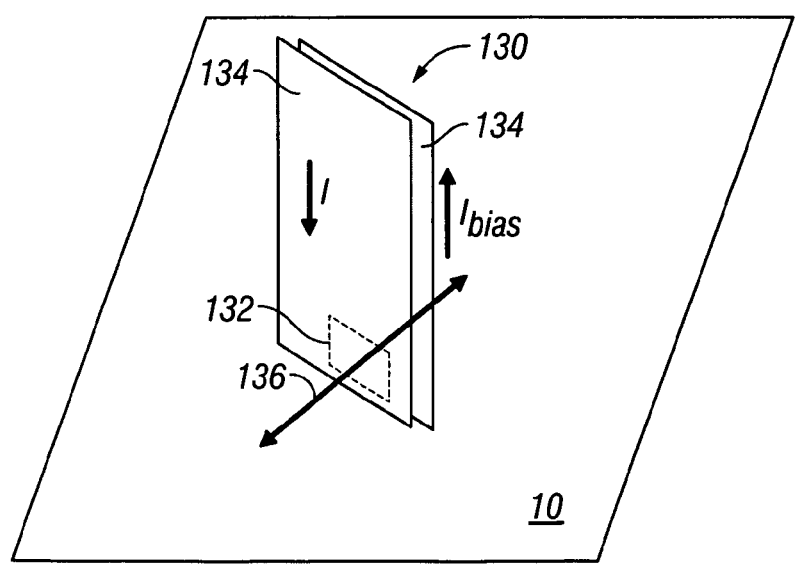
FIG. 11 is a perspective view showing a second exemplary embodiment of a probe head magnetic device of the test system of FIG. 1 implemented as a magnetic sensor for magnetic field generator characterization.

In FIG. 11, another exemplary magnetic sensor 130 is formed by sandwiching a soft ferromagnetic material layer 132, such as NiFe, CoFe or the like, between two planar conductive leads 134 made from copper or the like, that are otherwise electrically insulated from each other by an insulating layer (not shown) such as Al2O3, SiO2 or the like. Electrical current goes through the leads 134 and passes through the ferromagnetic layer 132, which forms a tip portion of the sensor 130. Resistance of the sensor 130 depends on the magnetization of the ferromagnetic layer 132 with respect to the current flowing direction according to AMR effect in the current perpendicular to plane (CPP) configuration. For the sensor 130, this direction is perpendicular to the sensor deposition plane (i.e., the direction shown by the arrow 136 in FIG. 11) and parallel to the surface of the work piece 10. This is intentionally chosen to give several advantages. First, because the current is flowing perpendicular to the deposition plane, the sensor 130 is sensitive only to the X-component of the magnetic field (i.e., in the direction of the arrow 136), and does not change its resistance state even when the sensor's in-plane magnetization is changing. Second, the sensor 130 has linear response even in large magnetic fields, because it has a very large de-magnetization factor in the direction perpendicular to the deposition plane. The high spatial resolution is obtained by the fact that the thickness of the ferromagnetic layer 132 is 1–10 nm, and its lateral dimensions can be made about 10–30 nm by utilizing E-beam lithography. Additionally, the sensor 130 is lapped so that the ferromagnetic layer 132 has a stripe height of ~5–10 nm.

Figure 12A:
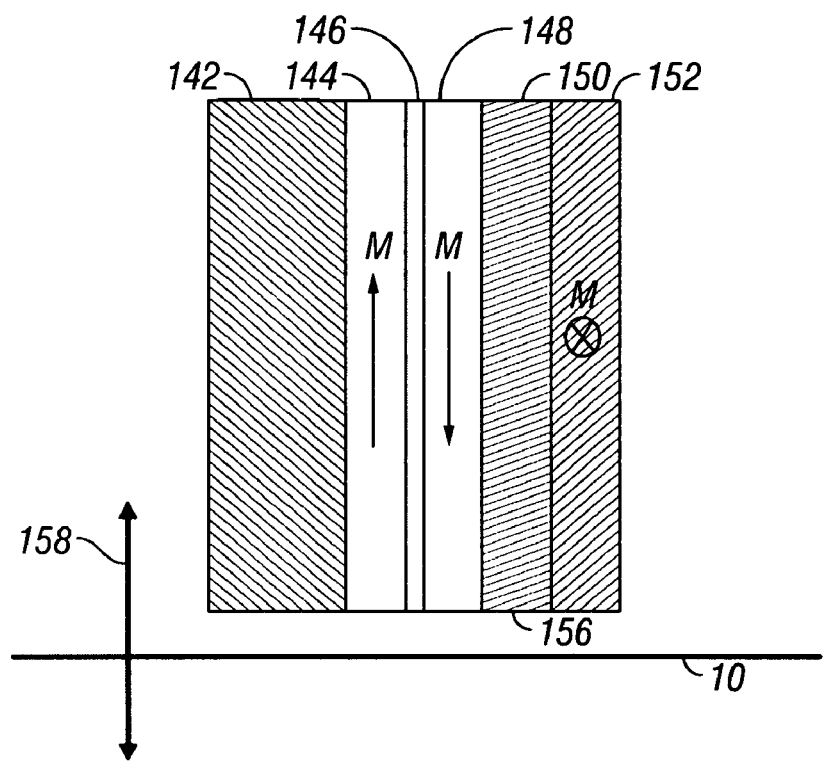
FIG. 12A is a cross-sectional view showing a third exemplary embodiment of a probe head magnetic device of the test system of FIG. 1 implemented as a magnetic sensor for magnetic field generator characterization.
Figure 12B:
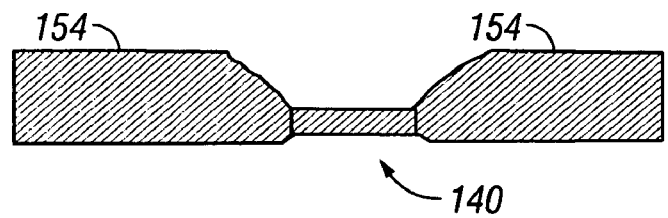
FIG. 12B is a top-down view of the magnetic sensor of FIG. 12A looking toward a work piece to be imaged.

In FIGS. 12A and 12B, another exemplary magnetic sensor 140 is shown. This multilayer structure is similar to the GMR sensors of magnetic recording read heads. It includes an anti-ferromagnetic pinning layer 142 made from PtMn or the like, a multilayer pinned structure comprising a first pinned layer 144 made from CoFe or the like, a non-magnetic spacing layer 146 made from Ru or the like, and a second pinned layer 148 made from CoFe or the like, a conductive spacer layer 150 made from Cu or the like, and a free sensing layer 152 made from NiFe or the like. An electrical sense current may be passed through the conductive leads 154 abutted to the pattern multilayer, and changes in resistance are proportional to the sin of the angle between the free layer 152 and the second pinned layer 148. The magnetization of the pinned layers 144 and 148 is pinned in the deposition plane perpendicular to the sensor's tip portion 156. By using E-beam lithography, the size of the sensor 140 can be made on the order of 10–30 nm, which determines the resolution of the sensor. The 140 sensor is sensitive to the out-of-plane component of the magnetic field parallel to the deposition planes and perpendicular to the surface of the work piece 10 (as shown by the arrow 158 in FIGS. 12A and 12B). Sensor structures similar to sensor shown in FIGS. 12A and 12B can also be made utilizing tunnel magneto-resistance effect (TMR).

Figure 13A:
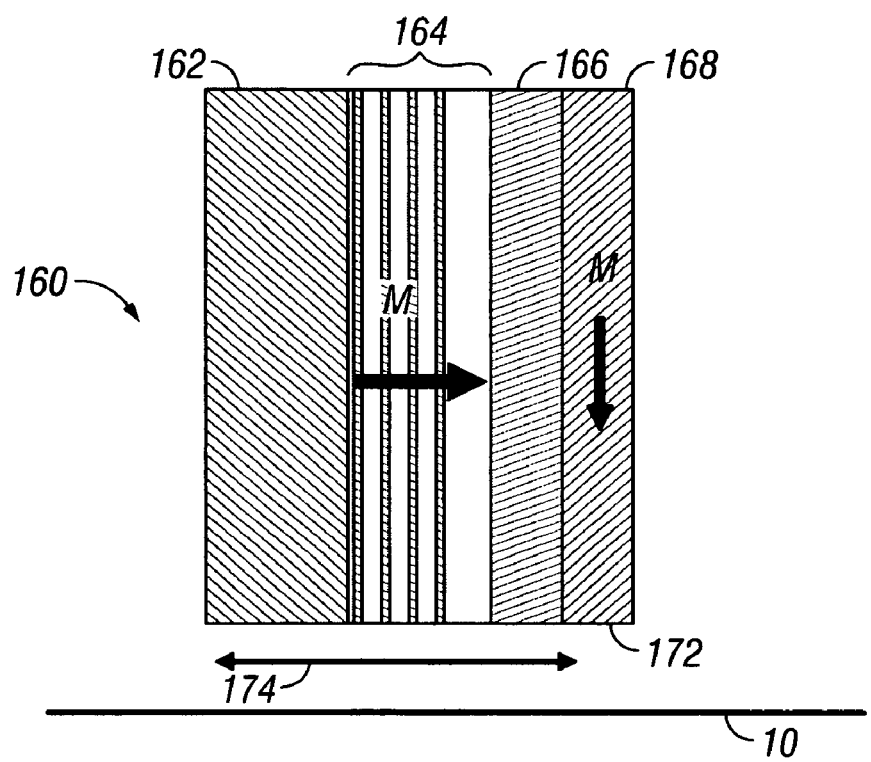
FIG. 13A is a cross-sectional view showing a fourth exemplary embodiment of a probe head magnetic device of the test system of FIG. 1 implemented as a magnetic sensor for magnetic field generator characterization.
Figure 13B:
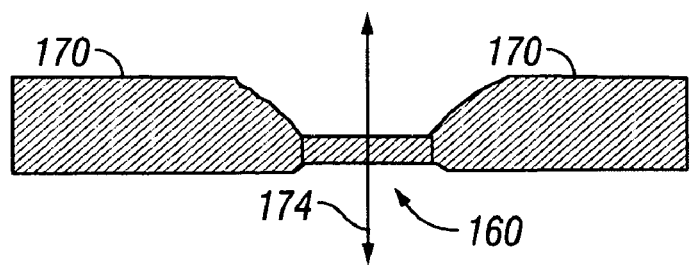
FIG. 13B is a top-down view of the magnetic sensor of FIG. 13A looking toward a work piece to be imaged.

In FIGS. 13A and 13B another sensor 160, also based on the GMR effect, is shown. The sensor 160 includes a pinning layer 162 made form PtMn or the like, a multilayer pinned structure 164 comprising CoFe and Ru layers, a spacer layer 166 made from Cu or the like, and a free layer 168 made from NiFe or the like. The sensor is abutted by a pair of conductive leads 170. Unlike the pinned layers of the sensor 140 shown in FIGS. 12A and 12B, the magnetization of the pinned multilayer structure 164 is pinned perpendicular to the deposition plane and parallel to the sensor's tip portion 172. This is achieved by utilizing high out-of-plane anisotropy of the multilayer CoFe pinned layers when their thickness is made on the order of 4–6 Angstroms. As such, the sensor 160 will be sensitive to a magnetic field perpendicular to the sensor deposition planes and parallel to the surface of the work piece 10 (i.e., in the direction of the arrow 174). Sensor structures similar to sensor shown in FIGS. 13A and 13B can also be made utilizing tunnel magneto-resistance effect (TMR).

In addition to forming the magnetic device 15 so as to include any of the foregoing magnetic sensors, it should be noted that is possible to combine on the same magnetic sensor structure more than one sensor, such that one will be sensitive to the in-plane component of the magnetic field, and the other to the out-of-plane component of the magnetic field. By recording the response of both sensors individually, all components of the magnetic field can be mapped.

Figure 14A:
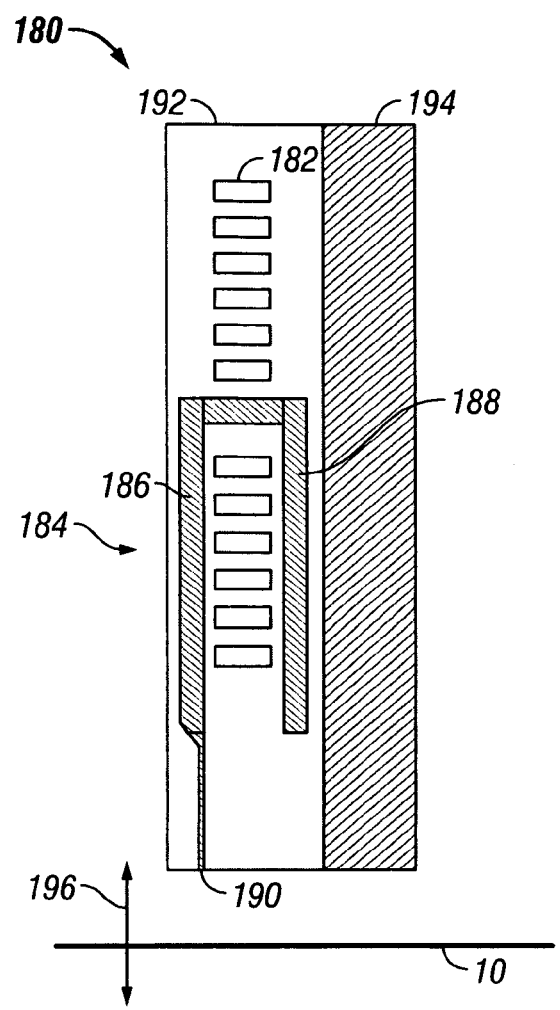
FIG. 14A is a cross-sectional view showing a first exemplary embodiment of a probe head magnetic device of the test system of FIG. 1 implemented as a magnetic stencil for magnetic sensor characterization.
Figure 14B:
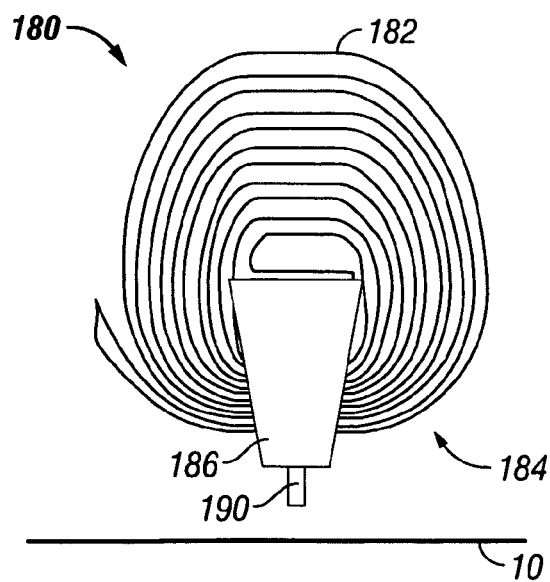
FIG. 14B is a plan view of the magnetic stencil of FIG. 15A.
Figure 15:
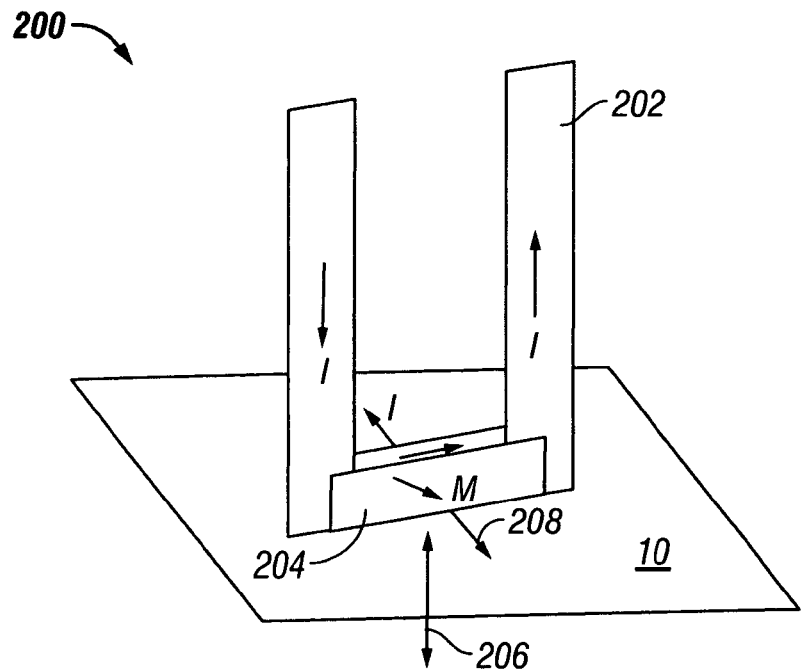
FIG. 15 is a perspective view showing a second exemplary embodiment of a probe head magnetic device of the test system of FIG. 1 implemented as a magnetic stencil for magnetic sensor characterization.
Figure 16:
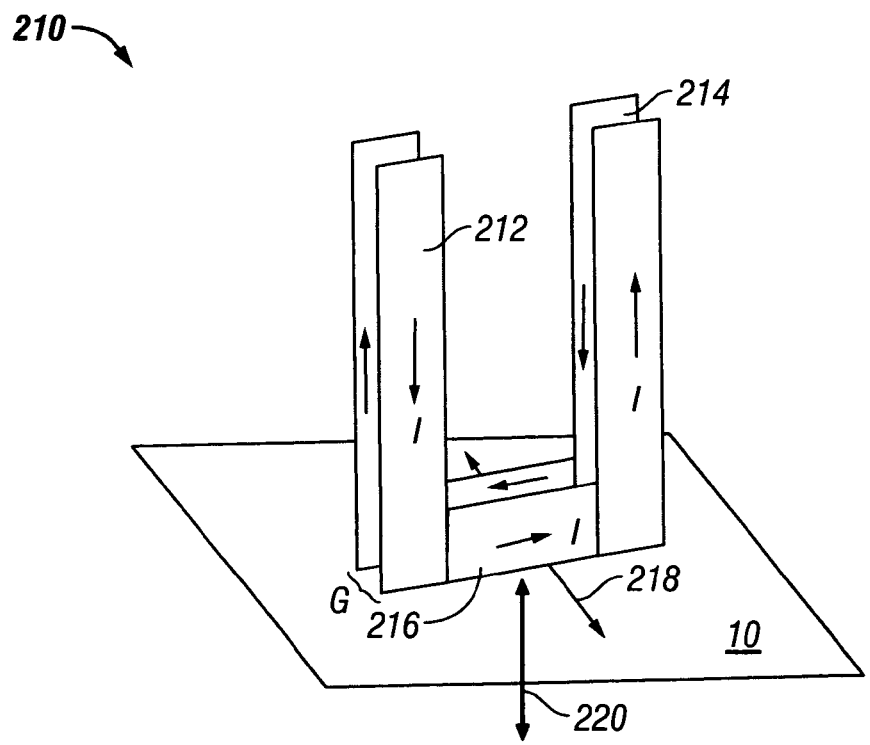
FIG. 16 is a perspective view showing a third exemplary embodiment of a probe head magnetic device of the test system of FIG. 1 implemented as a magnetic stencil for magnetic sensor characterization.

Turning now to FIGS. 14–16, exemplary implementations of the magnetic device 15 as magnetic stencils for use during the stimulation mode of the test system 2 are shown. In FIG. 14A, a magnetic stencil 180 is formed as a modified write head. The stencil 180 thus includes a plurality of coil loops 182 made from copper or the like that drive a yoke 184 made from a soft ferromagnetic material such as NiFe (permalloy), CoFe or other materials. The yoke 184 includes a pair of soft magnetic pole pieces 186 and 188, with the pole piece 186 being extended to form a stencil tip 190. The coil loops 182 and the yoke 184 are embedded in an insulative material 192, such as alumina ($Al_2O_3$), that is deposited over a suitable substrate 194. The stencil tip 190 is lithographically defined by the lift-off or by the ion-mill technique on a vacuum-deposited layer of soft ferromagnetic material, such as NiFe or the like. The thickness of the deposited material can be finely controlled to within few angstroms, with the total thickness preferably in the range of 1–10 nm. In the top-down view of FIG. 14B, the width of the stencil tip 190 is defined lithographically, and can be in the range of 10 nm to 100 um.

By passing electrical current into the coil loops 182, the magnetization of the pole pieces 186 and 188 is changed, resulting in a magnetic field being generated from the end of the stencil tip 190, perpendicular to the surface of the work piece 10 (i.e., the direction of the arrow 196). The magnetic field is confined to the cross-sectional size of the stencil tip structure. Because the magnetic field is localized to the space near the stencil tip 190, the very fine stencil tip thickness permits very high resolution in the primary scanning direction shown by the arrow 198. On the other hand, the stencil tip 190 can be made relatively wide in the perpendicular secondary scanning direction (e.g., about 10–100 um), for ease of alignment of the magnetic device 15 relative to the work piece 10, which could be a magnetic recording read head.

In FIG. 15, a magnetic stencil 200 is formed using another design alternative in which a wire 202 is lithographically processed from copper or the like is used to drive a soft adjacent layer 204 made from a soft ferromagnetic material such as NiFe, CoFe or the like. The soft adjacent layer 204 provides a tip portion of the stencil 200. The wire 202 passes a current "I" that alters the magnetic moment "M" of the soft adjacent layer 204 according to fluctuations in current magnitude and direction. Note that the direction of the magnetic moment "M" in the quiescent state can be oriented as shown in FIG. 200. The stencil generates a magnetic field that is perpendicular to the surface of the work piece 10 (i.e., the direction of the arrow 206). When the stencil is placed in an operative position with the layer plane normal to the work piece 10, the magnetic field will be parallel to the work piece surface. Advantageously, the soft adjacent layer 204 has a very narrow thickness of approximately 1–10 nm, thus permitting very high resolution in the primary scanning direction (shown by the arrow 208). On the other hand, the soft adjacent layer 204 is preferably relatively wide in the perpendicular secondary scanning direction (e.g., about 10–100 um), for ease of alignment of the magnetic device 15 relative to the work piece 10, but could be made using E-beam lithography as narrow as ~10 nm for applications requiring two-dimensional imaging.

In FIG. 16, a magnetic stencil 210 is formed using another design alternative featuring a pair of inductive coil loops 212 and 214, made from copper or the like. Each coil loop 212 and 214 passes a current I of equal magnitude but of opposite direction, and has a short section 216 providing a stencil tip portion. The coil loops 212 and 214 are separated by a suitable insulator, such as alumina, that defines a gap thickness "G." Advantageously, the gap "G" is very narrow (e.g., approximately 1–10 nm), thus permitting very high resolution in the primary scanning direction shown by the arrow 218. On the other hand, the width of each coil loop section 216 is preferably relatively wide in the perpendicular secondary scanning direction (e.g., about 10 um), for ease of alignment of the magnetic device 15 relative to the work piece 10. The electrical current passing through the coil loops 212 and 214 creates a magnetic field oriented parallel to the stencil layer planes and perpendicular to the work piece 10 (i.e., the direction of the arrow 220).

Accordingly, a magnetic imaging microscope test system has been disclosed. Additionally, its use for characterization of read and write heads used for magnetic recording has been described. While various embodiments of the invention have been described, it should be apparent that many variations and alternative embodiments could be implemented in accordance with the invention. It is understood, therefore, that the invention is not to be in any way limited except in accordance with the spirit of the appended claims and their equivalents.

What is claimed is:

1. A magnetic imaging microscope test system for characterization of read and write heads used for magnetic recording, comprising:
    a scanner assembly;
    a work piece holder for holding a work piece to be tested;
    said scanner assembly and said work piece holder being positionable relative to each other;
    a probe arm cantilevered from said scanner assembly and extending to a probe arm free end situated adjacent said work piece holder;
    a probe head at said probe arm free end, said probe head being configured to scan a work piece on said work piece holder while contacting engagement is maintained between said probe head and said work piece;
    a magnetic device associated with said probe head, said magnetic device being configured to magnetically interact with said work piece for obtaining a magnetic image of said work piece;
    circuitry adapted to produce a time-varying stimulus signal to selectively drive said work piece or said magnetic device at a selected frequency for characterizing said work piece; and
    circuitry adapted to obtain a readback signal from whichever of said work piece or said magnetic device is not driven by said stimulus signal, said readback signal being induced by said stimulus signal.

2. A test system in accordance with claim 1 wherein said work piece includes a magnetic field generator and said magnetic device comprises a magnetic sensor for characterizing magnetic output of said field generator.

3. A test system in accordance with claim 2 wherein said magnetic sensor comprises a magnetic flux pickup loop having a first portion providing a sensor tip and a second portion extending to a pair of electrical contacts, and an electrically conductive ground plane spaced from said pickup loop, said sensor being adapted to sense time-varying magnetic fields perpendicular to a plane of said pickup loop.

4. A test system in accordance with claim 2 wherein said magnetic sensor comprises a pair of non-magnetic electrically conductive material layers sandwiching a soft ferromagnetic material layer, said ferromagnetic layer providing a tip portion of said sensor and said sensor being adapted to sense magnetic fields perpendicular to a plane of said ferromagnetic layer.

5. A test system in accordance with claim 2 wherein said magnetic sensor comprises a multilayer structure having a pinning layer, a pinned layer structure, a spacer layer, and a ferromagnetic free layer, and a pair of electrodes sandwiching said multi-layer structure, one edge of said multilayer providing a tip portion of said sensor, said pinned layer having a magnetic moment pinned perpendicular to said sensor tip portion, said free layer having a magnetic moment biased parallel to said sensor tip portion, and said sensor being adapted to sense magnetic fields perpendicular to said sensor tip portion.

6. A test system in accordance with claim 2 wherein said magnetic sensor comprises a multilayer structure having a pinning layer, a pinned layer structure, a spacer layer, and a ferromagnetic free layer, and a pair of electrodes sandwiching said multi-layer structure, one edge of said multilayer providing a tip portion of said sensor, said pinned layer having a magnetic moment pinned perpendicular to layer planes of said multilayer structure, said free layer having a magnetic moment biased parallel to a plane of said free layer, and said sensor being adapted to sense magnetic fields perpendicular to said layer planes of said multilayer structure.

7. A test system in accordance with claim 1 wherein said work piece includes a magnetic field sensor and said magnetic device comprises a magnetic stencil for characterizing magnetic response of said field sensor.

8. A test system in accordance with claim 7 wherein said magnetic stencil comprises a write head having an inductive coil driving a pair of pole pieces having at least one pole tip extending to provide a tip portion of said stencil, said stencil being adapted to generate a magnetic field perpendicular to said stencil tip portion.

9. A test system in accordance with claim 7 wherein said magnetic stencil comprises a write head having an inductive coil driving a soft ferromagnetic layer providing a tip portion of said stencil, said stencil being adapted to generate a magnetic field parallel to a plane of said ferromagnetic layer and perpendicular to said stencil tip portion.

10. A test system in accordance with claim 7 wherein said magnetic stencil comprises a write head having a pair of spaced inductive coils extending to a work piece engaging surface of said probe head said coils including a short section providing a tip portion of said stencil being adapted to generate a magnetic field parallel to a plane of said ferromagnetic layer and perpendicular to said stencil tip portion.

11. A test method for characterization of read and write heads used for magnetic recording, comprising:
    scanning a work piece using a probe head while contacting engagement is maintained between said probe head and said work piece;
    said probe head having a magnetic device magnetically interacting with said work piece during said scanning;
    producing a time-varying stimulus signal to selectively drive said work piece or said magnetic device at a selected frequency for characterizing said work piece; and
    obtaining a readback signal from whichever of said work piece or said magnetic device is not driven by said stimulus signal, said readback signal being induced by said stimulus signal.

12. A method in accordance with claim 11 wherein said scanning comprises raster scanning in which said probe head is scanned in a primary scanning direction over said work piece and in which said probe head is scanned in a secondary scanning direction over said work piece while at plural primary scanning locations.

13. A method in accordance with claim 11 wherein said work piece includes a magnetic field generator and said magnetic device comprises a magnetic sensor for characterizing magnetic output of said field generator, and wherein said method includes driving said magnetic field generator with said time-varying stimulus signal to produce a magnetic field output while using said magnetic device to sense said magnetic field output.

14. A method in accordance with claim 13 wherein said magnetic field generator produces a magnetic field parallel to a surface of said work piece and perpendicular to a plane of said magnetic field sensor and wherein said magnetic field sensor is adapted to sense said magnetic field.

15. A method in accordance with claim 13 wherein said magnetic field generator produces a magnetic field perpendicular to a surface of said work piece and parallel to a plane of said magnetic field sensor and wherein said magnetic field sensor is adapted to sense said magnetic field.

16. A method in accordance with claim 13 wherein said time-varying stimulus signal is applied to drive said magnetic field generator to produce a time-variant magnetic field and said test meted comprises obtaining a time-domain image of said magnetic field generator.

17. A method in accordance with claim 16 wherein said time-domain image is obtained at a resolution of approximately 1 nsec.

18. A method in accordance with claim 13 wherein said test method comprises obtaining a spatial magnetic field image of said magnetic field generator at a resolution of approximately 1–10 nm.

19. A method in accordance with claim 11 wherein said work piece includes a magnetic field sensor and said magnetic device comprises a magnetic stencil for characterizing magnetic response of said magnetic field sensor, and wherein said method includes driving said magnetic stencil to produce a magnetic field output while using said magnetic field sensor to sense said magnetic field output.

20. A method in accordance with claim 19 wherein said magnetic stencil produces a magnetic field perpendicular a surface of said work piece and wherein said magnetic field sensor is adapted to sense said magnetic field.

21. A probe head for a magnetic imaging microscope test system for characterization of read and write heads used for magnetic recording, the test system having a scanner assembly, a work piece holder for holding a work piece to be tested, the scanner assembly and the work piece holder being positionable relative to each other, and a probe arm cantilevered from the scanner assembly and extending to a probe arm free end situated adjacent the work piece holder, said probe head comprising:
 a probe head body adapted to mount to said probe arm free end;
 magnetic device means for magnetically interacting with a magnetic field generating or magnetic field sensing work piece;
 a connection for receiving a time-varying stimulus signal that drives said magnetic device means at a selected frequency for characterizing said work piece; and
 a connection for providing a readback signal from said magnetic device means, said readback signal being induced by a time-varving stimulus signal applied to said workpiece.

22. A probe head in accordance with claim 21 wherein said work piece includes a magnetic field generator and said magnetic device means comprises a magnetic sensor for characterizing magnetic output of said field generator.

23. A probe head in accordance with claim 22 wherein said magnetic sensor comprises a magnetic flux pickup loop having a first portion providing a sensor tip and a second portion extending to a pair of electrical contacts, and an electrically conductive ground plane spaced from said pickup loop, said sensor being adapted to sense time-variant magnetic fields perpendicular to a plane of said pickup loop.

24. A probe head in accordance with claim 22 wherein said magnetic sensor comprises a pair of non-magnetic electrically conductive material layers sandwiching a soft ferromagnetic material layer, said ferromagnetic layer providing a tip portion of said sensor and said sensor being adapted to sense magnetic fields perpendicular to a plane of said ferromagnetic layer.

25. A probe head in accordance with claim 22 wherein said magnetic sensor comprises a multilayer structure having a pinning layer, a pinned layer structure, a spacer layer, and a ferromagnetic free layer, and a pair of electrodes sandwiching said multi-layer structure, one edge of said multilayer providing a tip portion of said sensor, said pinned layer having a magnetic moment pinned perpendicular to said sensor tip portion, said free layer having a magnetic moment biased parallel to said sensor tip portion, and said sensor being adapted to sense magnetic fields perpendicular to said sensor tip portion.

26. A probe head in accordance with claim 22 wherein said magnetic sensor comprises a multilayer structure having a pinning layer, a pinned layer structure, a spacer layer, and a ferromagnetic free layer, and a pair of electrodes sandwiching said multi-layer structure, one edge of said multilayer providing a tip portion of said sensor, said pinned layer having a magnetic moment pinned perpendicular to layer planes of said multilayer structure, said free layer having a magnetic moment biased parallel to a plane of said free layer, and said sensor being adapted to sense magnetic fields perpendicular to said layer planes of said multilayer structure.

27. A probe head in accordance with claim 21 wherein said work piece includes a magnetic field sensor and said magnetic device means comprises a magnetic stencil for characterizing magnetic response of said field sensor.

28. A probe head in accordance with claim 27 wherein said magnetic stencil comprises a write head having an inductive coil driving a pair of pole pieces having at least one pole tip extending to provide a tip portion of said stencil, said stencil being adapted to generate a magnetic field perpendicular to said stencil tip portion.

29. A probe head in accordance with claim 27 wherein said magnetic stencil comprises a write head having an inductive coil driving a soft ferromagnetic layer providing a tip portion of said stencil, said stencil being adapted to generate a magnetic field parallel to a plane of said ferromagnetic layer and perpendicular to said stencil tip portion.

30. A probe head in accordance with claim 27 wherein said magnetic stencil comprises a write head having a pair of spaced inductive coils extending to a work piece engaging surface of said probe head said coils including a short section providing a tip portion of said stencil being adapted to generate a magnetic field parallel to a plane of said ferromagnetic layer and perpendicular to said stencil tip portion.

* * * * *